United States Patent Office
2,906,647
Patented Sept. 29, 1959

2,906,647

METHOD OF TREATING SEMICONDUCTOR DEVICES

John Roschen, Hatboro, Pa., assignor to Philco Corporation, Philadelphia, Pa., a corporation of Pennsylvania No Drawing. Application February 25, 1957
Serial No. 641,805

5 Claims. (Cl. 117—200)

This invention relates to the manufacture of semiconductor devices, and more particularly to the treatment of such devices preparatory to the soldering of the leads thereto.

In some instances, the electrodes of semiconductor devices are not readily solderable, and therefore do not readily lend themselves to the soldering of leads thereto. An example of such devices is the silicon alloy transistor in which aluminum is alloyed with the surface of a silicon body. In the past, a jet plating process was used to plate the aluminum-silicon eutectic electrodes with a readily solderable material, such as nickel, without depositing such material on the silicon body. However, the jet plating process, while very well suited for some purposes, is not entirely satisfactory for the selective plating of the electrodes of semiconductor devices.

The principal object of the present invention is to provide a simple, inexpensive and efficient process for the selective plating of such electrodes. The process provided by this invention is much simpler and less expensive than the jet plating process for this purpose.

This invention is based on the discovery that if the surface of a semiconductor body is coated with a relatively thick oxide film, the film acts as a mask or barrier and precludes deposition on said body of a readily solderable material. It was found that during the usual processing of a silicon alloy transistor a relatively thick oxide film forms on the surface, and that this film precludes the electroless deposition on the silicon body of a readily solderable material such as nickel. Following this discovery, I conceived the possibility that selective plating of the electrodes could be achieved by simple immersion of the transistor in a plating bath containing the readily solderable material, while the oxide film is present on the semiconductor body. Experimentation proved this process to be not only practical but far superior in every way to the prior jet plating process.

In the practice of this invention it is necessary (1) that there be a sufficiently thick oxide film on the semiconductor body, (2) that the electrode surfaces be conditioned to receive the plating material, and (3) that the temperature of the plating bath and the immersion time be such as to effect the desired plating of the electrode surfaces but not to dissolve the oxide film on the semiconductor body.

While no limitation of the invention is intended, its use in connection with silicon alloy transistors has shown it to be very well suited therefor, and it will be described herein with particular reference to such use.

First, with respect to the provision of a sufficiently thick oxide film on the semiconductor body, as already mentioned, the usual processing of a silicon alloy transistor results in the formation of an oxide film which is sufficiently thick for the purpose of this invention. However, in any case where such a film is not already provided, it can be readily produced by exposing the silicon surface to ambients such as oxygen, oxygen and water, and nitrogen and water at elevated temperatures. For example, the film may be produced simply by exposing the silicon surface to an air ambient at 500° C. for one minute.

Next, with respect to conditioning the electrode surfaces to receive the plating material, this is necessary in order to provide complete coverage and good adhesion. The preferred procedure is to abrade the electrode surfaces, and then dip the device in a hydrochloric acid bath and rinse it in water, to remove any film from said surfaces. Of course, abrasion of the silicon surface would tend to defeat the purpose of this invention, and therefore such abrasion must be avoided. The abrasion of the electrode surfaces may be accomplished by scratching the surfaces with a fine metal probe in a hand operation, or it may be done in suitable automatic equipment.

An alternative procedure for conditioning the electrode surfaces simply involves preferential etching of the surfaces with hydrochloric acid and then rinsing.

Still another procedure involves preferential etching of the electrode surfaces, followed by chemical deposition of zinc thereon. It has been found that the subsequent bath plating proceeds at a faster rate on a zinc treated surface. However, prolonged exposure in a zinc plating bath should be avoided, as it may remove the oxide film on the semiconductor body and may result in plating thereon. An example of a satisfactory zinc plating bath and schedule is as follows:

| | |
|---|---|
| $ZnSO_4.7H_2O$ | 756 grams/liter. |
| HF (48%) | 3.5% by volume. |
| Temperature | 77° F. |
| Time | 1½ minutes. |
| Rinse | Water (30 seconds). |

While in some instances etching may be utilized to remove film from the electrode surfaces, as in the last two procedures above mentioned, it should be noted that this cannot be done where the electrode surfaces have a silicon oxide film of substantial thickness. The reason for this is that an etch which will remove such film and prepare said surfaces for plating will also tend to remove the oxide film from the silicon body of the semiconductor device. It is for this reason that it is preferred to abrade the electrode surfaces to loosen any film thereon, and then utilize an etch which will remove the film from said surfaces without appreciably affecting the oxide film on the silicon body.

Finally, with respect to the path plating of readily solderable material, this should be done within a short time after the conditioning of the electrode surfaces while the latter are free of any film. Experimentation with silicon alloy transistors has shown that an alkaline plating bath is preferable to an acid plating bath, as with an acid bath the time and temperature conditions are quite critical and there is a tendency to produce a flaky deposit, with the aluminum being converted to aluminum hydroxide.

In the case of silicon alloy transistors, the conventional alkaline plating solution given below has been found to be very satisfactory:

| | Grams |
|---|---|
| $NiCl_2.6H_2O$ | 30 |
| $NaH_2PO_2.H_2O$ | 10 |
| $(NH_4)_2HC_6H_5O_7$ | 65 |
| $NH_4Cl$ | 50 |

$H_2O$ to make one liter.
$NH_4OH$ to make pH 8 to 9.

Prolonged immersion in the alkaline bath should be avoided, as it may cause the oxide film on the silicon surface to be dissolved, resulting in the deposition of nickel thereon. A two minute immersion, with the bath at a temperature of approximately 92° C., has been found to give excellent results, although a temperature range of 90° C. to 97° C. and an immersion time range of ½ minute to 2½ minutes have been found to produce satisfactory results.

The ammonium hydroxide is added until the pH is between 8.0 and 9.0. Within two minutes after the addition of the ammonium hydroxide, the semiconductor devices whose electrodes are to be plated are immersed in the solution preferably for two minutes. They are then removed and are rinsed in running water to remove the plating salts. Preferably they are finally rinsed in ethyl alcohol for approximately thirty seconds to remove any remaining salts and to hasten drying.

From the foregoing description, it will be seen that this invention provides a novel method of selectively plating an electrode or electrodes of a semi-conductor device with a readily solderable material for which the semiconductor body and the electrodes both have affinity, which method is particularly characterized in that it comprises immersing the device in a bath containing said material while said body is coated with an oxide film of sufficient thickness to preclude deposition of said material on said body. It will be understood, of course, that any suitable plating material may be employed. Thus, while nickel has been mentioned in connection with the plating of aluminum-silicon eutectic electrodes of a silicon alloy transistor, materials such as cobalt and cobalt-nickel alloys can also be used for this purpose.

As previously mentioned, the method according to this invention is much simpler and less expensive than the previously employed jet plating process. By this method, the plating of electrodes of semiconductor devices can be performed in a batch operation, it being possible to bath-plate a substantial number of devices at the same time. This method eliminates the need for complex and expensive equipment such as employed in the jet plating process.

Another important advantage of this method is that it produces a better product due to the excellent adhesion of the plating to the electrodes. Comparative tests of transistors produced by this method and by the jet plating process have shown that a much better soldered joint results from the employment of this method. Tension tests have shown that the soldered joint resulting from the employment of this method is able to withstand much greater tensional stress than is the soldered joint resulting from the employment of the jet plating process.

While this invention has been described with particular reference to the plating of aluminum-silicon eutectic electrodes of silicon alloy transistors, this is not to be taken as imposing any limitation on the invention. As hereinbefore indicated, the invention is intended to be applicable to any semiconductor device whose electrode surfaces it is desired or necessary to plate with a readily solderable material. Moreover, the method according to this invention may be modified as required to adapt it to any particular application.

I claim:

1. In the manufacture of a semiconductor device having on the semiconductor body at least one electrode composed of a metal which cannot readily be soldered, a method of selectively plating said electrode with a readily-solderable metallic material for which said body and said electrode both have affinity, which method comprises providing on said body an oxide film of sufficient thickness to preclude deposition of said material on said body, conditioning said electrode to receive said material, immersing said device in a bath containing said material at a temperature and for a time sufficient to effect plating of said material on said electrode without dissolving said oxide film, during which immersion said oxide film is effective to preclude deposition of said material on said body, and finally rinsing and drying said device.

2. In the manufacture of a semiconductor device having on the semiconductor body at least one electrode composed of a metal which cannot readily be soldered, a method of selectively plating said electrode with a readily-solderable metallic material for which said body and said electrode both have affinity, which method comprises providing on said body an oxide film of sufficient thickness to preclude deposition of said material on said body, conditioning said electrode by abrasion to receive said material, immersing said device in a bath containing said material at a temperature and for a time sufficient to effect plating of said material on said electrode without dissolving said oxide film, during which immersion said oxide film is effective to preclude deposition of said material on said body, and finally rinsing and drying said device.

3. In the manufacture of a semiconductor device having on the semiconductor body at least one electrode composed of a metal which cannot readily be soldered, a method of selectively plating said electrode with a readily-solderable metallic material for which said body and said electrode both have affinity, which method comprises providing on said body an oxide film of sufficient thickness to preclude deposition of said material on said body, preferentially etching the surface of said electrode to condition it to receive said material, immersing said device in a bath containing said material at a temperature and for a time sufficient to effect plating of said material on said electrode without dissolving said oxide film, during which immersion said oxide film is effective to preclude deposition of said material on said body, and finally rinsing and drying said device.

4. In the manufacture of a semiconductor device having on the semiconductor body at least one electrode composed of a metal which cannot readily be soldered, a method of selectively plating said electrode with a readily-solderable metallic material for which said body and said electrode both have affinity, which method comprises providing on said body an oxide film of sufficient thickness to preclude deposition of said material on said body, preferentially etching the surface of said electrode, immersing said device in a solution containing zinc at a temperature and for a time sufficient to effect plating of the zinc on said electrode without removing said oxide film, rinsing and drying said device, immersing said device in a bath containing said material at a temeperature and for a time sufficient to effect plating of said material on said electrode without dissolving said oxide film, during which latter immersion said oxide film is effective to preclude deposition of said material on said body, and finally rinsing and drying said device.

5. In the manufacture of a semiconductor device having on the semiconductor body at least one electrode composed of a metal which cannot readily be soldered, a method of selectively plating said electrode with nickel for which said body and said electrode both have affinity, which method comprises providing on said body an oxide film of sufficient thickness to preclude deposition of nickel on said body, conditioning said electrode by abrasion to receive nickel, immersing said device in a solution containing nickel at a temperature within the range of 90° C. to 970° C. and for a time within the range of ½ minute to 2½ minutes, thereby to plate the nickel on said electrode without dissolving said oxide film, during which immersion said oxide film is effective to preclude deposition of the nickel on said body, and finally rinsing and drying said device.

References Cited in the file of this patent

UNITED STATES PATENTS

| | | |
|---|---|---|
| 2,169,098 | Howe | Aug. 8, 1939 |
| 2,662,957 | Eisler | Dec. 15, 1953 |
| 2,695,852 | Sparks | Nov. 30, 1954 |
| 2,757,104 | Howes | July 31, 1956 |
| 2,781,577 | Smellie | Feb. 19, 1957 |

UNITED STATES PATENT OFFICE
CERTIFICATE OF CORRECTION

Patent No. 2,906,647 September 29, 1959

John Roschen

It is hereby certified that error appears in the printed specification of the above numbered patent requiring correction and that the said Letters Patent should read as corrected below.

Column 2, line 48, for "path" read -- bath --; column 3, line 17, for "semi-conductor" read -- semiconductor --; column 4, line 45, for "temeperature" read -- temperature --; line 61, for "970° C." read -- 97° C. --.

Signed and sealed this 29th day of March 1960.

(SEAL)
Attest:

KARL H. AXLINE
Attesting Officer

ROBERT C. WATSON
Commissioner of Patents